(12) United States Patent
Chen et al.

(10) Patent No.: US 7,209,003 B2
(45) Date of Patent: Apr. 24, 2007

(54) ASYNCHRONOUS BTL DESIGN FOR A CLASS-D AUDIO AMPLIFIER

(75) Inventors: Ming Hsiung Chen, Hsin Tien (TW); Shang Shu Chung, Hsin Tien (TW)

(73) Assignee: Princeton Technology Corporation, Hsin Tien (TW)

( * ) Notice: Subject to any disclaimer, the term of this patent is extended or adjusted under 35 U.S.C. 154(b) by 150 days.

(21) Appl. No.: 11/041,237

(22) Filed: Jan. 25, 2005

(65) Prior Publication Data
US 2006/0125554 A1    Jun. 15, 2006

(51) Int. Cl.
*H03F 3/38* (2006.01)
(52) U.S. Cl. ...................................... 330/10
(58) Field of Classification Search ................. 330/10, 330/251, 207 A
See application file for complete search history.

(56) References Cited
U.S. PATENT DOCUMENTS 6,104,248 A * 8/2000 Carver ....................... 330/297
6,674,325 B2 * 1/2004 Chen et al. ............ 330/124 D

* cited by examiner

*Primary Examiner*—Robert Pascal
*Assistant Examiner*—Hieu Nguyen
(74) *Attorney, Agent, or Firm*—Birch, Stewart, Kolasch & Birch, LLP

(57) ABSTRACT

The present invention provides an asynchronous BTL (Bridge Tied Load) design for a Class-D audio amplifier. The Class-D audio amplifier comprises two independent signal routes, each of the two independent signal routes includes a PWM (Pulse Width Modulator), a predriver and a power MOS circuit; each of the two independent signal routes receives an input signal via the PWM thereof, and outputs signal through the power MOS circuit thereof, and then cooperatively drive a loudspeaker; no synchronous signal is inputted to each of the two PWMs, and the two power MOS circuits feed back independent signals respectively to the two PWMs. The present invention omits the synchronous design of the prior art, and let the two push-pull signals required by the BTL design being processed independently, while cooperatively drive the loudspeaker.

4 Claims, 4 Drawing Sheets

(a)

(b)

ASYNCHRONOUS BTL DESIGN FOR A CLASS-D AUDIO AMPLIFIER

FIELD OF THE INVENTION

The present invention relates to an improvement of a Class-D audio amplifier design, and more particularly to an asynchronous BTL (Bridge Tied Load) design for a Class-D audio amplifier.

BACKGROUND OF THE INVENTION

Referring to FIGS. 1(a) and (b), which show the output carrier signals OUTA and OUTB of a push-pull type Class-D audio amplifier. The output carrier signals OUTA and OUTB of the push-pull type Class-D audio amplifier have the same carrier phase as shown in FIG. 1(a), or have a constant phase shift therebetween (for example 180°) as shown in FIG. 1(b). In general use, the output carrier signals will be filtered by a filter or human ears, therefore the synchronous design for the output carrier signals is not necessary.

Referring to FIG. 2, which shows schematically a circuit for Class-D audio amplifier. An audio signal $V_{in}$ is inputted from left to the two input terminals "a", "b" of an operational amplifier 1. The operational amplifier 1 outputs two audio signals respectively to operational amplifier 2 and 3 (both are comparators), and then pass through the predriver 4 and 5 for driving power CMOS circuits 6 and 7 to generate output signals OUTA and OUTB. Output signals OUTA and OUTB drive the loudspeaker 8 cooperatively, this is a push-pull type circuit, and is what so-called BTL (Bridge Tied Load) design. Resistors 9 and 10 are used for feedbacking signals; capacitors 11 and 12 are compensation circuits; inductors 13, 14 and capacitors 15, 16 are filter circuits. Triangular wave $V_{triangular}$ of 500 KHz is inputted to operational amplifiers 2 and 3 for synchronizing the two carrier signals inputted to the operational amplifiers 2 and 3, therefore the phases of the carriers of output signals OUTA and OUTB will be the same with each other, as shown in FIG. 1(a); or the phases of the carriers of output signals OUTA and OUTB will have a phase shift of 180°, as shown in FIG. 1(b). The operational amplifiers 1, 2 and 3 cooperatively form a PWM (Pulse Width Modulator) for the Class-D audio amplifier. A PWM has varieties of design. FIG. 2 shows only one of them.

An additional triangular wave generator is required for generating the triangular wave $V_{triangular}$, but a triangular wave generator is very complicated in design and is not very easy to generate very accurate triangular wave. An additional triangular wave generator will occupy too much space in an IC design, thus increasing cost. The triangular wave $V_{triangular}$ for synchronizing the two carrier signals of the output signals OUTA and OUTB is not really necessary.

Moreover, feedback signals of the output signals OUTA and OUTB via resistors 9, 10 to the operational amplifier 1 must be very accurate, otherwise the operational amplifiers 1 cannot keep its two output audio signals in balance, but this requirement causes a narrow tolerance in IC layout, thus increasing manufacturing cost.

SUMMARY OF THE INVENTION

It is therefore an object of the invention to provide an asynchronous BTL design for a Class-D audio amplifier. Two independent signal routes are designed as shown in FIG. 3, each comprises a PWM (Pulse Width Modulator), a predriver and a power MOS circuit; each of the two independent signal routes receives an input signal via the PWM thereof, and outputs signal through the power MOS circuit thereof, and then cooperatively drive a loudspeaker; no synchronous signal is inputted to each of the two PWMs; and the two power MOS circuits feed back independent signals (before filter/after filter) respectively to the two PWMs. The present invention omits the synchronous design of the prior art, and let the two push-pull signals required by the BTL design being processed independently, while cooperatively drive the loudspeaker.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more filly understood from the detailed description given hereinbelow and the accompanying drawings which are given by way of illustration only, arid thus are not limitative of the present invention, and wherein.

DETAILED DESCRIPTION OF THE EMBODIMENT

Figure 3:
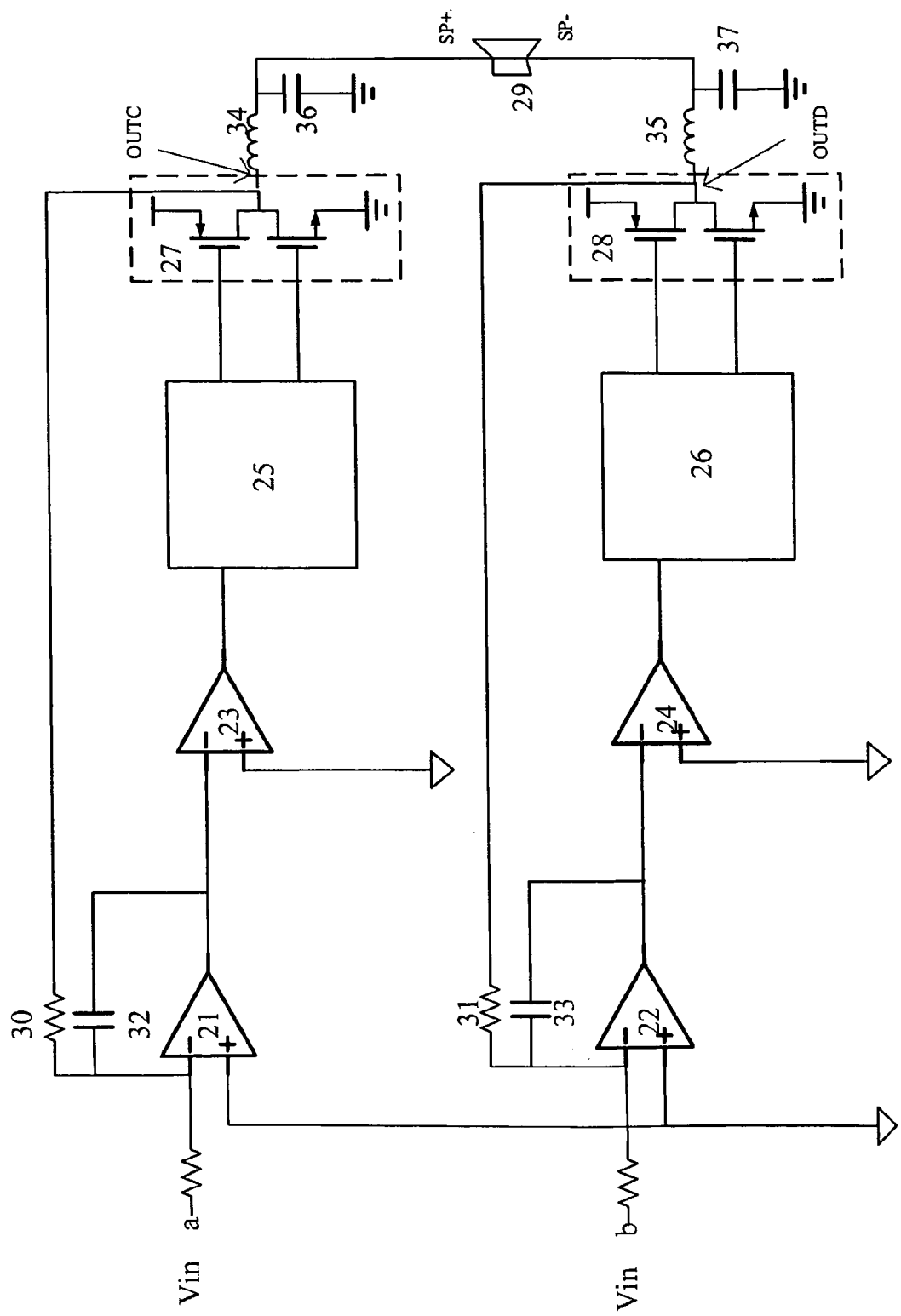
FIG. 3 shows schematically the circuit of a Class-D audio amplifier according to the present invention.

Referring to FIG. 3, which shows an improvement for a Class-D audio amplifier according to the present invention. Audio signals $V_{in}$ are inputted from left to the two input terminals "a" and "b" of operational amplifiers 21 and 22 respectively. The operational amplifiers 21 and 22 output audio signal respectively to operational amplifiers 23 and 24, and then pass through the predrivers 25 and 26 for driving power CMOS circuits 27 and 28 to generate output signals OUTC and OUTD. Output signals OUTC and OUTD cooperatively drive the loudspeaker 29. This is a push-pull type circuit, and is what so-called BTL (Bridge Tied Load) design. Resistors 30 and 31 are used for feedbacking signals; capacitors 32 and 33 are compensation circuits; inductors 34, 35 and capacitors 36, 37 are filter circuits. Each of the operational amplifiers 21, 23 and the operational amplifiers 22, 24 forms a PWM (Pulse Width Modulator) for the Class-D audio amplifier. A PWM has varieties of design. FIG. 3 shows only one of them.

Figure 4:
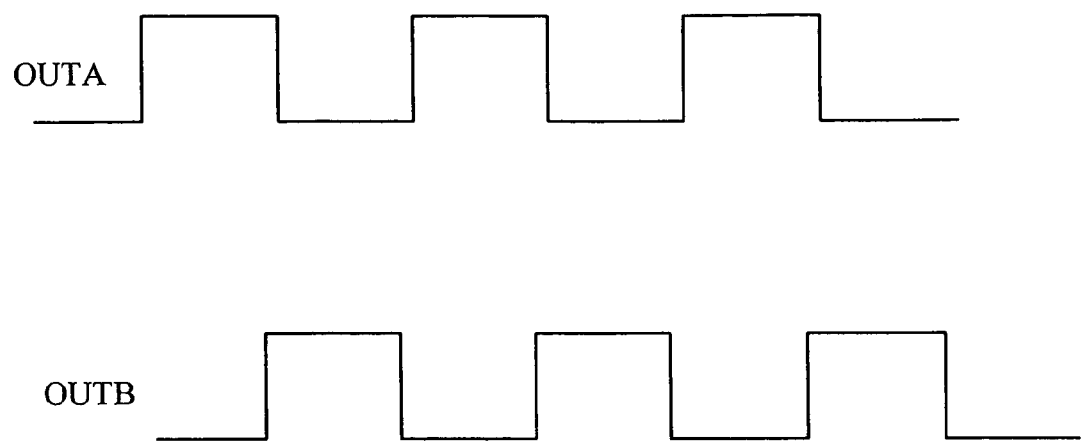
FIG. 4 shows schematically the output signals of the Class-D audio amplifier according to the present invention.

The most important feature in FIG. 3 is that there is no triangular wave $V_{triangular}$ of 500 Khz inputted to the operational amplifiers 23, 24 for synchronization, therefore the output signals OUTC and OUTD have different phases, as shown in FIG. 4. This improvement omits a complicated triangular wave generator, saves the circuit space in IC layout, thereby decreasing cost. A synchronous design of triangular wave is not necessary to operational amplifiers 23 and 24, since the triangular wave just synchronizes the carrier signals. The carrier signals of the output signals OUTC and OUTD will be filtered by a filter circuit or by human ears, so the synchronization for carriers is not important.

Figure 1:
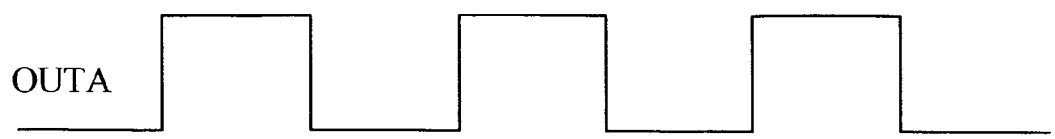
FIG. 1 shows schematically the output signals of a conventional Class-D audio amplifier.
Figure 1:
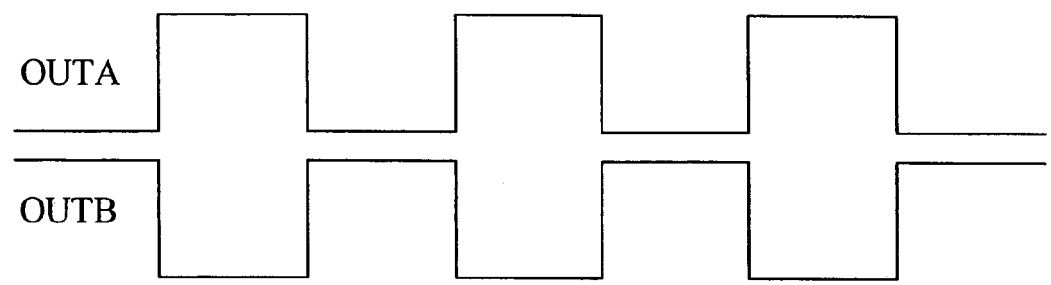
Figure 2:
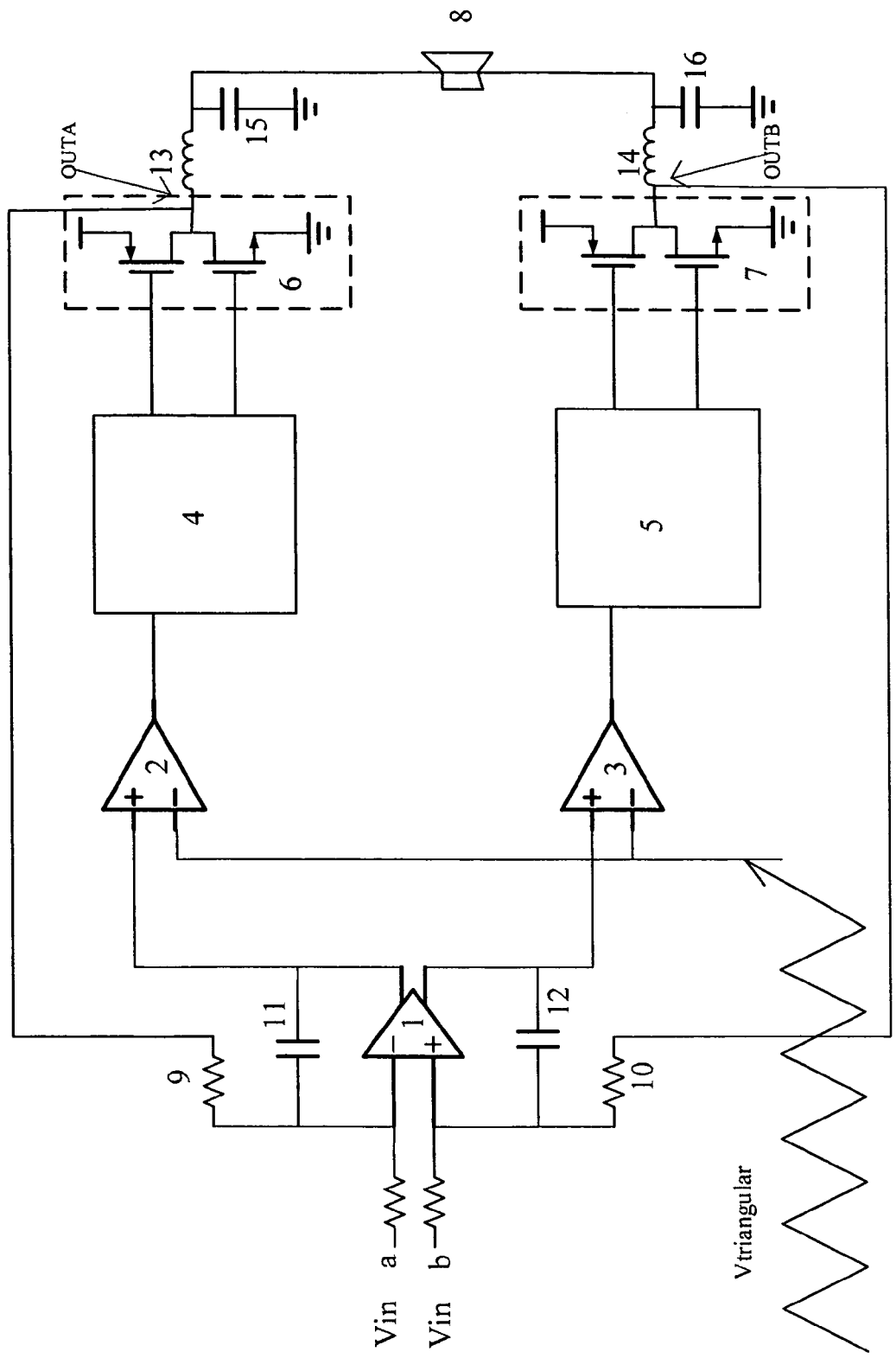
FIG. 2 shows schematically the circuit of a conventional Class-D audio amplifier.

In FIG. 2, feedback signals of the OUTA and OUTB via resistors 9, 10 to the operational amplifier 1 must be very accurate, otherwise the operational amplifiers 1 cannot keep its two output audio signals in balance, but this requirement causes a narrow tolerance in IC layout, thus increasing manufacturing cost; while in FIG. 3, feedback signals of the OUTC and OUTD are independently fed to the operational amplifier 21, 22 via resistors 30, 31 respectively, this permits a broader tolerance in IC layout, thus decreasing manufacturing cost.

In FIG. 3, feedback signals of the OUTC and OUTD are independently fed to the operational amplifier 21, 22 via resistors 30, 31 respectively, this can be modified by feed-backing signals SP+ and SP− of the loudspeaker 29 to the operational amplifier 21, 22 via resistors 30, 31 respectively.

In FIG. 3, each of the CMOS circuits 27, 28 can be replaced by a MOS circuit.

The spirit and scope of the present invention depend only upon the following Claims, and are not limited by the above embodiments.

What is claimed is:

1. An asynchronous BTL (Bridge Tied Load) design for a Class-D audio amplifier, the Class-D audio amplifier comprises two independent signal routes, each of the two independent signal routes includes a PWM (Pulse Width Modulator), a predriver and a power MOS circuit; each of the two independent signal routes receives an input signal via the PWM thereof, and outputs signal through the power MOS circuit thereof, and then cooperatively drive a loudspeaker; no synchronous signal is inputted to each of the two PWMs, and the two power MOS circuits feed back independent signals respectively to the two PWMs.

2. An asynchronous BTL (Bridge Tied Load) design for a Class-D audio amplifier according to claim 1, wherein a filter circuit is connected to an output terminal of each of the two power MOS circuits; output signals of the two filters cooperatively drive the loudspeaker; two input signals of the loudspeaker are fed back to the two PWMs respectively.

3. An asynchronous BTL (Bridge Tied Load) design for a Class-D audio amplifier according to claim 1, wherein the power MOS circuit is a power CMOS circuit.

4. An asynchronous BTL (Bridge Tied Load) design for a Class-D audio amplifier according to claim 2, wherein the power MOS circuit is a power CMOS circuit.

* * * * *